US007558390B2

(12) United States Patent
Nielsen et al.

(10) Patent No.: US 7,558,390 B2
(45) Date of Patent: Jul. 7, 2009

(54) LISTENING DEVICE

(75) Inventors: Jakob Nielsen, Waterloo (CA); Robert Brennan, Kitchener (CA); Todd Schneider, Waterloo (CA)

(73) Assignee: AMI Semiconductor, Inc., Pocatello, ID (US)

( * ) Notice: Subject to any disclaimer, the term of this patent is extended or adjusted under 35 U.S.C. 154(b) by 181 days.

(21) Appl. No.: 10/023,109

(22) Filed: Dec. 14, 2001

(65) Prior Publication Data

US 2003/0053646 A1 Mar. 20, 2003

(30) Foreign Application Priority Data

Sep. 7, 2001 (CA) .................................... 2357200

(51) Int. Cl.
*H03G 5/00* (2006.01)

(52) U.S. Cl. ...................................................... 381/103

(58) Field of Classification Search ................. 381/103, 381/56, 316–318, 83, 93–94, 94.3, 113, 312, 381/320, 313, 97–98

See application file for complete search history.

(56) References Cited

U.S. PATENT DOCUMENTS

| | | | | |
|---|---|---|---|---|
| 3,654,390 | A * | 4/1972 | Puckette | 178/69.5 |
| 3,997,764 | A * | 12/1976 | Belmonte et al. | 324/76.64 |
| 4,142,072 | A | 2/1979 | Berland | 179/107 FD |
| 5,206,913 | A | 4/1993 | Sims | 381/103 |
| 5,233,665 | A * | 8/1993 | Vaughn et al. | 381/97 |
| 5,426,703 | A * | 6/1995 | Hamabe et al. | 381/71 |
| 5,602,962 | A * | 2/1997 | Kellermann | 704/226 |
| 5,737,433 | A * | 4/1998 | Gardner | 381/94.7 |
| 5,825,898 | A * | 10/1998 | Marash | 381/92 |
| 6,048,320 | A * | 4/2000 | Brainard, II | 600/559 |
| 6,236,731 | B1 | 5/2001 | Brennan et al. | 381/316 |

(Continued)

FOREIGN PATENT DOCUMENTS

| | | |
|---|---|---|
| EP | 1018854 | 7/2000 |

(Continued)

OTHER PUBLICATIONS

Roberts, R. A. et al., "Digital Signal Processing," ISBN 0-201-16350-0, pp. 486-487.*

(Continued)

*Primary Examiner*—Vivian Chin
*Assistant Examiner*—Lun-See Lao
(74) *Attorney, Agent, or Firm*—Troutman Sanders LLP; James Hunt Yancey, Jr.; Ryan A. Schneider

(57) ABSTRACT

A method for equalizing output signals from a plurality of signal paths is disclosed. The method comprises steps of identifying a transfer function for each of signal paths, determining a filtering function for each signal path such that a product of the transfer function, and the filtering function is a selected function and applying the filtering function to the corresponding signal path, thereby correcting the transfer function of the signal path to the selected function to equalize the output signals from the signal paths. The step of applying the filtering function comprises steps of providing an equalization filter to the signal path and applying the filtering function to the equalization filter of its corresponding signal path, thereby equalizing output signals from the filter of the signal paths.

48 Claims, 4 Drawing Sheets

30a

U.S. PATENT DOCUMENTS

| | | | | |
|---|---|---|---|---|
| 6,240,192 | B1 | 5/2001 | Brennan et al. | 381/314 |
| 6,272,229 | B1 | 8/2001 | Baekgaard | 381/313 |
| 6,665,410 | B1 * | 12/2003 | Parkins | 381/71.1 |
| 7,062,039 | B1 * | 6/2006 | Rasmusson | 379/406.1 |
| 2001/0038702 | A1 * | 11/2001 | Lavoie et al. | 381/307 |
| 2004/0109578 | A1 * | 6/2004 | Niederdrank et al. | 381/318 |

FOREIGN PATENT DOCUMENTS

| | | | |
|---|---|---|---|
| EP | 1018854 | A1 | 8/2000 |

OTHER PUBLICATIONS

T. Schneider, DG. Jamieson, "A Dual channel MLS-Based Test system for Hearing-Aid Characterization", J audio Eng. Soc, vol. 41, No. 7/8, Jul./Aug. 1993, p. 583-593.*

Schneider, T. et al., "A Dual-Channel MLS-Based Test System for Hearing-Aid Characterization," J. Audio Eng. Soc., vol. 41, No. 7/8, Jul./Aug. 1993, pp. 583-593.

PCT International Search Report, International App. No. PCT/CA01/01509, dated Apr. 17, 2003, pp. 1-3.

Examination Report from related European Application No. 01982007.5 dated May 3, 2007.

* cited by examiner

LISTENING DEVICE

FIELD OF THE INVENTION

The present invention generally relates to a listening device, and more particularly relates to a method for equalizing output signals from a plurality of signal paths processing a plurality of sound signals in a listening device, including hearing aids and headsets, speech recognition front-ends and hands-free telephony systems.

BACKGROUND OF THE INVENTION

The background of the invention is described with particular reference to the field of directional hearing aid, where the present invention is applied, although not exclusively.

Conventionally, hearing aids utilize two microphones spaced apart at a predetermined short distance in order to capture an incoming sound signal. Such devices are often referred to as a directional hearing aid since the subsequent processing of the two audio inputs results in a better directionality perception by the user of the hearing aid. Similar techniques are applied in a number of applications where there is spatial separation between the desired signal and noise sources. Examples include headsets, speech recognition systems and hands-free telephony in automobiles.

In FIG. 1, there is shown a schematic representation of a prior art hearing aid, which is generally denoted by a reference numeral 10. As depicted in FIG. 1, the device includes two microphones 11*a* and 11*b*, two amplifiers 12*a* and 12*b*, two analog-to-digital (A/D) converters 13*a* and 13*b*, a combiner 15, a digital signal processor (DSP) 16, a digital-to-analog (D/A) converter 17, and a loud speaker 18, which are successively connected. In operation, a sound signal coming from a surrounding environment, for example, from a person to whom a user of the device speaks, is captured by the microphone 11*a*, in which the sound signal is converted to an electrical analog signal. The electrical analog signal is input to the amplifier 12*a*, where the analog signal is amplified to a higher specific level. Subsequently, the amplified analog signal is converted to a digital representation (a digital signal) of the sound signal in the A/D converter 13*a*. Similarly, the other signal path, consisting of the microphone 11*b*, the amplifier 12*b*, and the A/D converter 13*b*, performs the same operation as above to produce another digital representation (digital signal) of the sound signal. The two digital signals are then processed in the combiner 15 where the two digital signals are combined into one single signal. The output signal of the combiner 15 may be further processed in the DSP (digital signal processor) 16 where, for example, the signal is filtered or further amplified according to the specific requirements of the application. Alternatively, the combiner 15 can be incorporated into the DSP 16 such that the signal combining can be done in the DSP.

Finally, the amplified and processed digital signal is converted back to an electrical analog signal in the digital-to-analog converter 17 and then converted into sound waves through the loud speaker 18, or applied directly to another systems as an electrical system from the output of the digital-to-analog converter 17.

With the hearing aid noted above, however, use of matched microphones is required in order to perform a satisfactory directionality enhancement through combination and processing of the two audio signals. In this context, the matched microphones mean that they have equal transfer functions and thus equal magnitude and phase responses in a specified frequency range. The concept of matched microphones will be further described in greater detail in conjunction with the description of the preferred embodiments of the present invention.

Currently, the provision of matched microphones has been attempted by using microphone pairs that have been matched by a microphone manufacturer. That is, the microphone manufacturer produces a number of microphones, followed by pairing of the microphones that have similar magnitude and phase response. The manual handling of the microphones affects their properties, and prevents automation of the manufacturing process. Also, additional costs are incurred in the attempt to match the microphones, though they are only matched within a specified tolerance.

Also, U.S. Pat. Nos. 4,142,072 and 5,206,913 disclose microphone matching technologies. However, none of current methods are expected to be satisfactorily successful.

Therefore, there is a need to solve the problems noted above and also a need for an innovative approach to replace the prior art.

SUMMARY OF THE INVENTION

According to one aspect of the invention, there is provided a method for equalizing output signals from a plurality of signal paths in a listening device. The method comprises steps of: (a) identifying a transfer function for each of the signal paths, (b) determining a filtering function for each signal path such that a product of the transfer function and the filtering function is a selected function, and (c) applying the filtering function to the corresponding signal path, thereby correcting the transfer function of the signal path to the selected function to equalize the output signals from the signal paths.

The selected function may be the transfer function for one of the plurality of signal paths. The filtering function may be set to a selected common factor.

In one embodiment, the step of applying the filtering function comprises steps of: (a) providing a filter means to the signal path and (b) applying the filtering function to the filter means of its corresponding signal path, thereby equalizing output signals from the filter means of the signal paths.

In another embodiment, the step of identifying a transfer function comprises steps of: (a) providing a sample signal to the signal path to produce a sample output signal through the signal path and (b) processing the sample signal and the sample output signal to identify the transfer function for its corresponding signal path.

The signal path comprises (a) a microphone for converting a sound signal to an electrical analog signal; and (b) an analog-to-digital converter coupled to the microphone for converting the electrical analog signal into a digital signal, wherein the step of identifying a transfer function comprises steps of: (a) providing a noise sample to the microphone to produce a sample output signal through the signal path and (b) processing the noise sample and the sample output signal to identify the transfer function of its corresponding signal path. The transfer function of the signal path may be a transfer function of the microphone of each signal path.

The step of identifying a transfer function comprises steps of: (a) acoustically providing a noise sample to the microphone with a propagation time delay to produce a first output processed through the signal path, (b) providing a second output corresponding to the noise sample with the propagation time delay, and (c) processing the first output and the second output to identify the transfer function of its corresponding signal path. The propagation delay time is selected to be integer multiple of the noise sample.

The step of providing the noise sample comprises steps of: (a) providing a first digital noise signal, and (b) converting the first digital noise signal into the noise sample. The step of providing a second output comprises steps of: (a) providing a second digital noise signal, the second digital noise signal being synchronized with the first digital noise signal and having properties corresponding to the first digital noise signal, (b) delaying the second digital noise signal by same amount of time as the propagation delay time, and (c) compensating the conversion factor of the first digital noise signal into the noise sample.

The first and second digital noise signals are provided by a maximum length sequence generator. The first and second noise signals comprise a white noise signal or a random noise signal.

According to another aspect of the invention, there is provided an apparatus for equalizing output signals from a plurality of signal paths in a listening device. The apparatus comprises: (a) means for identifying a transfer function for the signal path, (b) means for determining a filtering function for the signal path such that a product of the transfer function and the filtering function is a selected function, and (c) means for applying the filtering function to its corresponding signal path, thereby correcting the transfer function of the signal path to the selected function to equalize the output signals from the signal paths.

The selected function may be the transfer function for one of the signal paths. The filtering function can be a common factor.

In one embodiment, the filtering function applying means comprises: (a) a filter means provided to the signal path, and (b) means for applying the filtering function to the filter means of its corresponding signal path, thereby equalizing output signals from the filter means of the signal paths.

In another embodiment, the transfer function identifying means comprises: (a) means for providing a sample signal to the signal path to produce a sample output signal through the signal path, and (b) means for processing the sample signal and the sample output signal to identify the transfer function for its corresponding signal path.

The signal path comprises (a) a microphone for converting a sound signal to an electrical analog signal; and (b) an analog-to-digital converter coupled to the microphone for converting the electrical analog signal into a digital signal, wherein the transfer function identifying means comprises: (a) means for providing a noise sample to the microphone to produce a sample output signal through the signal path, and (b) means for processing the noise sample and the sample output signal to identify the transfer function of its corresponding signal path. The transfer function of the signal path may be a transfer function of the microphone.

The transfer function identifying means comprises: (a) means for acoustically providing a noise sample to the microphone with a propagation time delay to produce a first output processed through the signal path, (b) means for providing a second output corresponding to the noise sample with the propagation time delay, and (c) means for processing the first output and the second output to identify the transfer function of its corresponding signal path. The propagation delay time is selected to be integer multiple of the first noise sample.

The noise sample providing means comprises: (a) means for generating a first noise signal, and (b) means for converting the first digital noise signal into the noise sample. The second output providing means comprises: (a) means for generating a second digital noise signal, the second digital noise signal being synchronized with the first digital noise signal and having properties corresponding to the first digital noise signal; (b) means for delaying the second digital noise signal by same amount of time as the propagation delay time; and (c) means for compensating the conversion factor of the first digital noise signal into the noise sample. The converting means includes a digital-to-analog converter and in some applications, a loud speaker.

The first and second digital noise signal providing means are a maximum length sequence generator.

The first and second digital noise signals are a white noise signal or a random noise signal.

The first and second digital noise signals can be provided by a single source.

According to another aspect of the present invention, there is provided a method for correcting transfer functions of a plurality of signal paths. The method comprises steps of: (a) identifying a transfer function for each of the signal paths, (b) determining a filtering function for each signal path such that a product of the transfer function and the filtering function is a selected function, and (c) applying the filtering function to the corresponding signal path, thereby correcting the transfer function of the signal path to the selected function.

Embodiments of the invention include a listening device including hearing aids and headset, speech recognition system front-ends and hands-free telephony front-ends, which utilizes the methods described above and/or comprises the apparatus described above.

According to the present invention summarized above, the equalization process is carried out digitally so that absolute matching of the microphones can be accomplished. Therefore, the listening device user can get better speech intelligibility in noisy environments. Also, the equalization procedure of the invention is simply to deploy in production because the equalization is performed on the digital listening device chip by using a "one button" procedure. Thus, the work and expense to match microphones can be saved.

A further understanding of the other features, aspects, and advantages of the present invention will be realized by reference to the following description, appended claims, and accompanying drawings.

BRIEF DESCRIPTION OF THE DRAWINGS

Embodiments of the invention will now be described with reference to the accompanying drawings, in which.

DETAILED DESCRIPTION OF THE PREFERRED EMBODIMENT(S)

The preferred embodiment will be described with particular reference to a hearing aid and a headset, to which the present invention is principally applied, but not exclusively.

Figure 1:
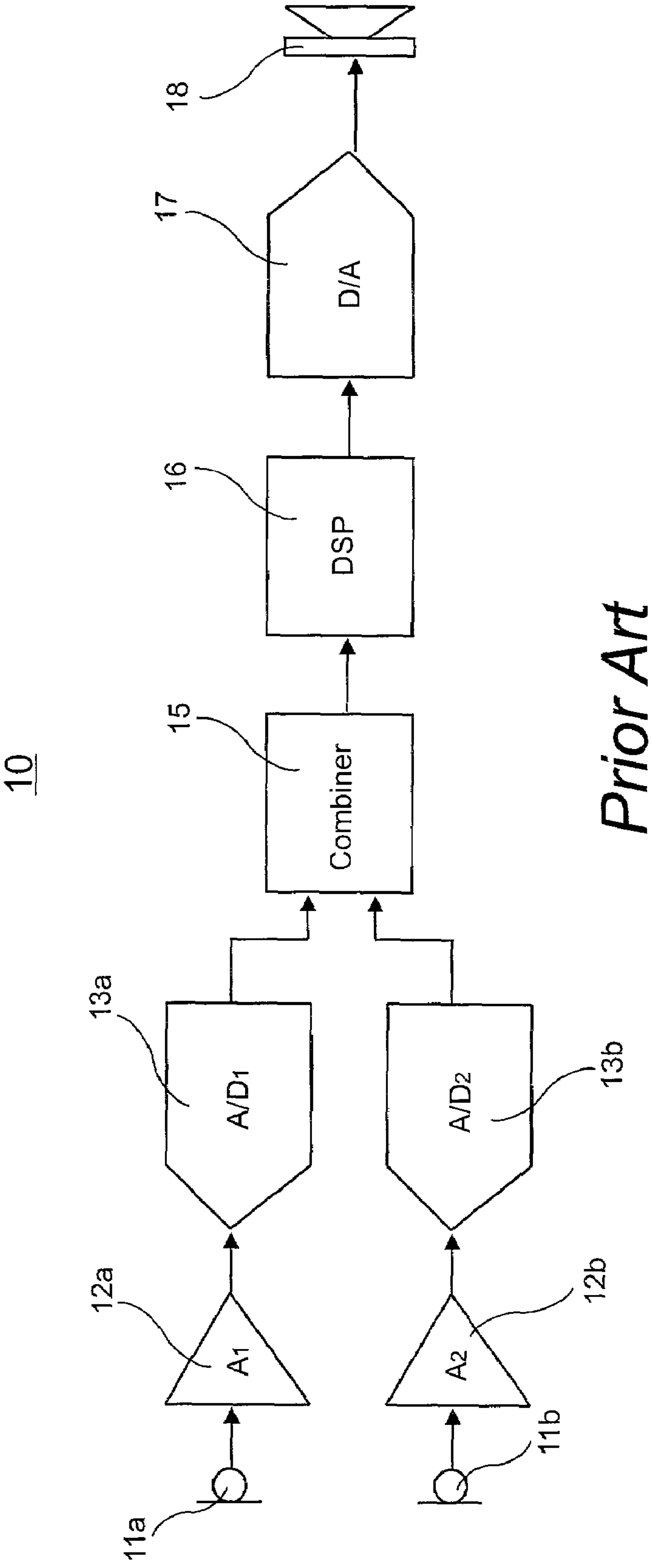
Prior Art FIG. 1
FIG. 1 is a schematic representation of a prior art hearing aid.
Figure 2A:
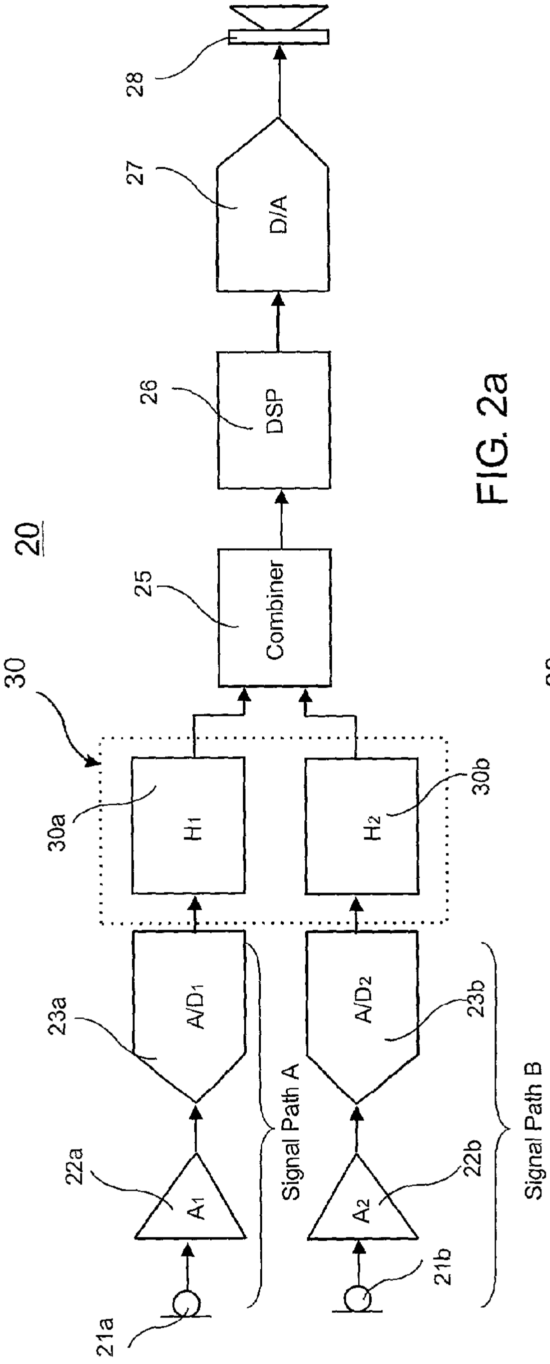
FIG. 2*a* is a schematic representation of a hearing aid according to one embodiment of the invention.

As one preferred embodiment of the present invention, a hearing aid using the inventive concept is schematically illustrated in FIG. 2*a*, where the hearing aid is generally denoted by a reference numeral 20. As depicted in FIG. 2*a*, the hearing aid includes two microphones 21*a* and 21*b*, two amplifiers 22*a* and 22*b*, two analog-to-digital (A/D) converters 23*a* and 23*b*, two equalizing filter means 30*a* and 30*b*, a combiner 25, a digital signal processor (DSP) 26, a digital-to-analog (D/A) converter 27, and a loud speaker 28, which are successively connected. The configuration of the hearing aid is similar to the prior art shown in FIG. 1, except for the equalizing filter means generally designated by reference numerals 30*a* and 30*b*, which constitute a significant concept and feature of the present embodiment of the invention and will be further described in greater detail hereinafter, particularly in conjunction with the description of FIG. 3.

For the convenience of the description and explanation of the invention, the signal path consisting of the microphone 21*a*, the amplifier 22*a* and the A/D converter 23*a* is referred to as signal path A, and the signal path consisting of the microphone 21*b*, the amplifier 22*b* and the A/D converter 23*b* as signal path B. In this embodiment, two signal paths A and B are illustrated; however, more than two signal paths may be utilized, depending upon applications of the present invention.

In general operation, sound signals from a surrounding environment are converted into electrical analog signals via the microphones 21*a* and 21*b* respectively. Each of the analog signals is then fed to the respective amplifier 22*a* or 22*b*, where each signal is amplified to a specific level. The two amplified analog signals are converted through the respective analog-to-digital converter 23*a* or 23*b* to digital signals, which correspond respectively to a digital representation for the input of two microphones 21*a* and 21*b*. Subsequently, these digital signals are equalized by passing through the respective equalizing filters means 30*a* or 30*b*, which are generally denoted by a reference numeral 30. The equalizing means 30 and advantages associated with them will be further detailed below.

The two digital signals are then processed in the combiner 25 where the two digital signals are combined into one single signal. This combination can be performed in various ways, i.e., by delaying one input signal before subtracting both input signals, or by applying more complicated directional processing methods. The output signal of the combiner 25 may be further processed in the DSP (digital signal processor) 26, where, for example, the signal is filtered or further amplified according to the specific requirements of the application of the invention, including the hearing loss of a user. Finally, the amplified and processed digital signal is converted back to an electrical analog signal in the digital-to-analog converter 27 and then converted into sound waves through the loud speaker 28.

Alternatively, the DSP 26 can be replaced by an oversampled weighted-overlap add (WOLA) filterbank or a general purpose DSP core, which are described in U.S. Pat. Nos. 6,236,731 and 6,240,192 respectively. The disclosures of the patents are incorporated herein by reference thereto.

In order to facilitate the understanding of the present invention, the concept of a transfer function of a microphone or a signal path, matched and unmatched microphones, and the signal equalization will be described before disclosing the inventive concept of the equalizing filter means. A microphone converts an audio signal into an electrical signal. However, different microphones respond differently to the audio signal.

Thus, the conversion from the audio domain to the electrical domain can be represented in terms of a transfer function or a filtering function. Together with the different magnitude response, a phase difference between the audio signal at the microphone inlet and the electrical output signal is also part of the transfer function due to the fact that the phase lag varies with the frequency.

Within the microphone pass band, the attenuation and the time lags at the different frequencies are described in terms of a magnitude response and a phase response respectively of the microphone transfer function. As will be understood to those skilled in the art, the same idea will be applied to a signal circuit, for example, to the signal paths A and B as shown in FIG. 2*a*. In this embodiment of FIG. 2*a*, therefore, the transfer functions of the two microphones 21*a* and 21*b* may be described as M1 and M2 respectively. Also, the magnitude term is described as mag(M1) and mag(M2) and the phase term as ph(M1) and ph(M2) respectively. Consequently, in the frequency region of interest, the criteria of matched microphones can be defined as:

"A microphone 1 and a microphone 2 are said to be matched if M1 is equal to M2, i.e., mag(M1) is equal to mag(M2) and ph(M1) is equal to ph(M2)."

In the prior art, they have been approximately matched. Thus, the above criteria of matched microphones could not be met in the prior art.

Figure 2B:
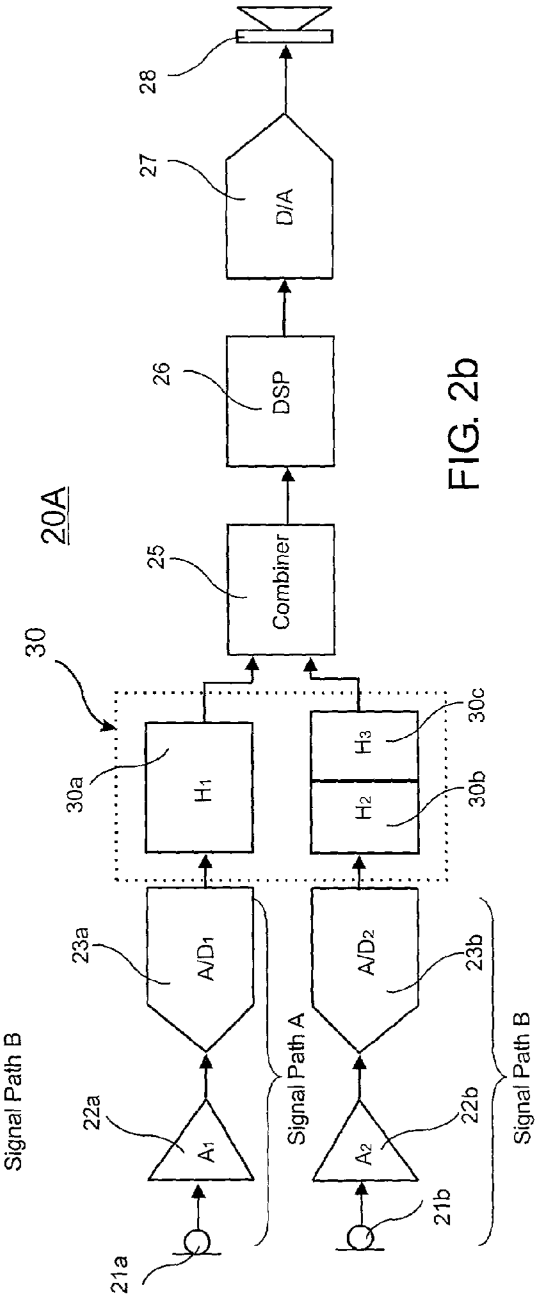
FIG. 2*b* is a schematic representation of a headset according to another embodiment of the invention.
Figure 2C:
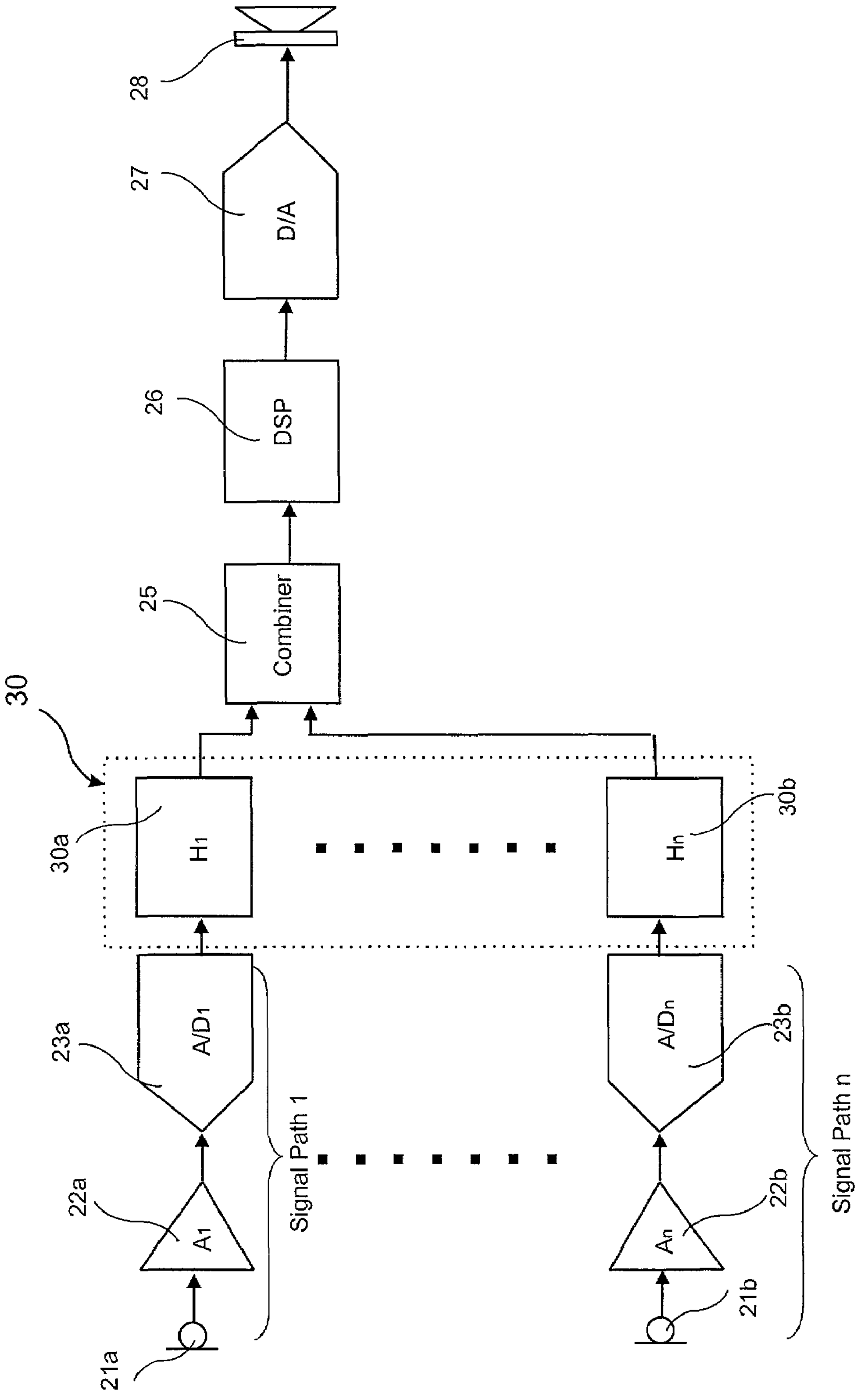
FIG. 2*c* is a schematic representation showing an embodiment of multiple signal paths according to the invention.

The equalizing filter means 30*a* and 30*b* in FIG. 2*a* provide a solution to the problems in the prior art noted above. Referring to FIG. 2*a*, the concept of the equalizing filter means is explained below. Firstly, the transfer functions (M1 and M2) of the microphones 21*a* and 21*b* are identified, and secondly filtering functions (H1 and H2) are determined so that the overall transfer function between the inlet of the microphone and the output of the equalizing filter means can be equal to a certain selected function (F) for every individual microphone or signal path, which is generally represented by the following equation:

$$\begin{aligned} M1*H1 &= F \\ M2*H2 &= F \\ M3*H3 &= F \\ &\vdots \\ &\vdots \\ Mn*Hn &= F, \end{aligned} \tag{1}$$

where n is the number of microphones or signal paths as illustrated in FIG. 2*c*.

Therefore, each filtering function (H1, H2, H3, . . . , Hn) can be readily determined by dividing each equation with the transfer functions (M1, M2, M3, . . . ,Mn), which have been identified in the previous step. As will be understood by those skilled in the art, the transfer functions M1 and M2 may be identified for a signal path, for example, the signal paths A and B in FIG. 2*a*. Thus, in the embodiment of FIG. 2*a*, by applying the filtering function H1 and H2, the two output signals from the equalizing filter means are shaped in an identical way even though they might have been shaped differently by the two unmatched microphones 21*a* and 21*b*, or by the two signal paths A and B.

Alternatively, the selected function (F) can be set up to a common factor A for the convenience of subsequent computations, which can be generally represented by the following equations:

$$M1*H1=A \quad (2)$$
$$M2*H2=A$$
$$M3*H3=A$$
$$\vdots$$
$$\vdots$$
$$Mn*Hn=A,$$

where n is the number of microphones or the number of signal paths. Therefore, each filtering function (H1, H2, H3, . . . , Hn) can be readily determined according to the equation (1) or (2) by using the transfer functions (M1, M2, M3, . . . ,Mn), which have been identified in the previous step.

Figure 3:
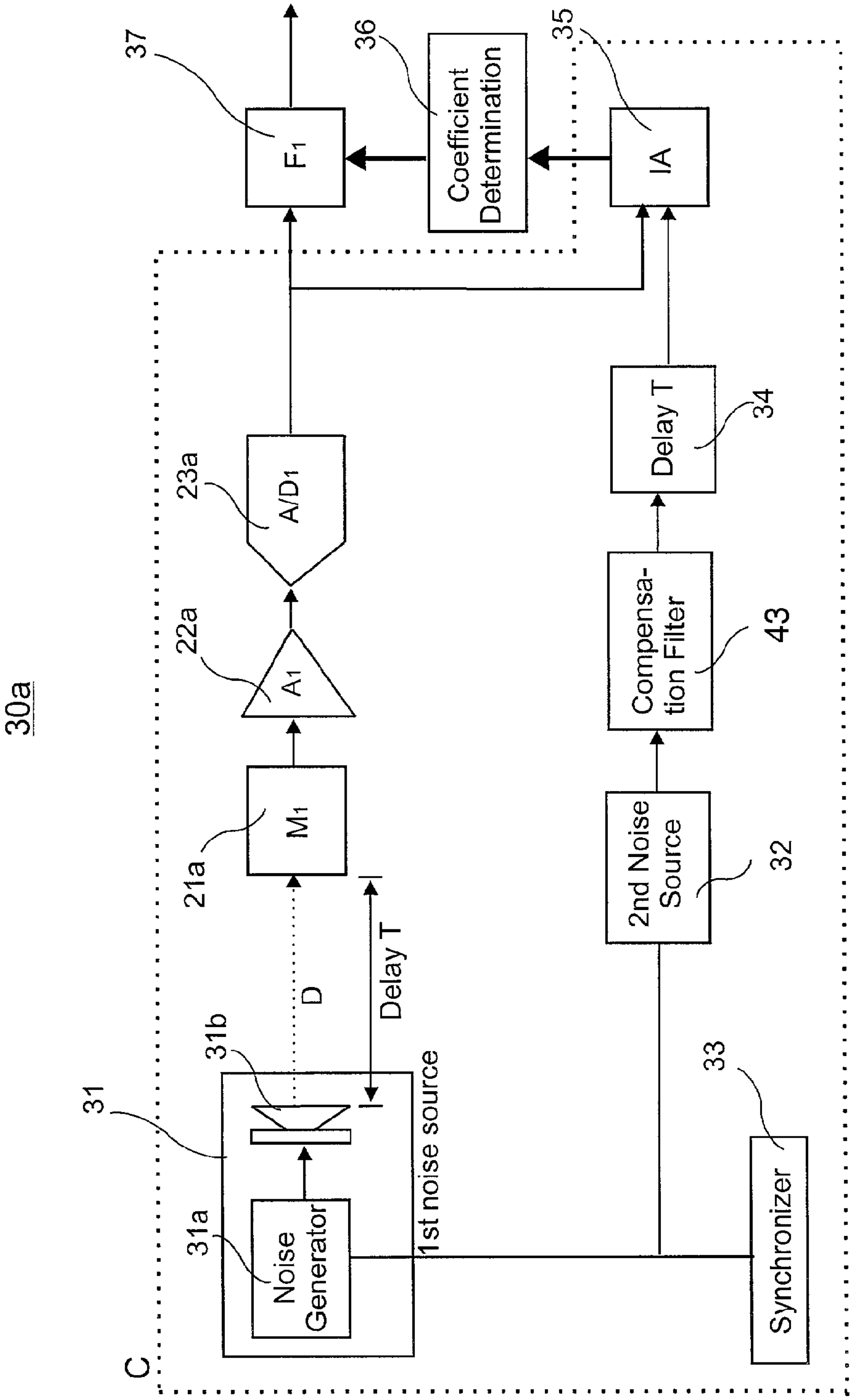
FIG. 3 is a schematic illustration of the equalizing filter means in FIGS. 2 and 2*a*.

FIG. 3 depicts an embodiment of the equalizing filter means in accordance with the present invention. For the convenience of the description, although one equalizing filter means 30*a* for the signal path A is illustrated in FIG. 3, the same configuration can be applied to every signal path. As noted above, the equalizing filter means of the invention, in general, comprises two major functional components, one is means for identifying a transfer function (M) of the signal path to which the corresponding equalizing filter means is coupled, and the other is means for determining a filtering function (H) so that a whole transfer function of the signal path after being processed by the equalizing means become a certain constant function. The transfer function (M) of the signal path can be a transfer function of a microphone in the respective signal path.

As shown in FIG.3, in this embodiment, the equalizing filter means 30*a* is coupled to the microphone 21*a*, the amplifier 22*a*, and the analog-to-digital converter 23*a*, which are from the signal path A in FIG. 2*a*. The equalizing filter means 30*a* comprises a first noise source 31, a second noise source 32, a synchronizer 33 for the first and second noise sources 31 and 32, a compensation filter 43, a delay block 34, and an identification block 35, a coefficient determination block 36, and an equalization filter 37. In FIG. 3, except for the coefficient determination block 36 and the equalization filter 37, all the elements which are bounded by a dot line C constitute the means for identifying a transfer function (M), which is one of two major functional components as noted above. The two remaining elements, the coefficient determination block 36 and the equalization filter 37, are corresponding to the means for determining a filtering function (H) depending upon the transfer function (M) identified by the previous means.

The first and second noise sources 31 and 32 may include an MLS (Maximum Length Sequence) generator. The MLS generator is a noise generator which generates white noise or random noise in a controlled and predictable way; see T.Schneider, D. G. Jamieson, "A Dual channel MLS-Based Test System for Hearing-Aid Characterization", J. Audio Eng. Soc, Vol. 41, No. 7/8, 1993 July/August, p 583-593, the disclosure of which is incorporated herein by reference thereto. Ideally This MLS noise has an equal magnitude at all frequencies. Also, the fact that the noise can be generated in a controlled way means that the random noise is always the same on a sample-by-sample basis. Therefore, it is possible to have two or more noise generators, i.e., MLS generators, produce the exact same noise sample at different instants in time although the noise is said to be randomly distributed. In alternate, one common noise generator can be used for both the first and second noise sources 31 and 32.

All the elements in FIG. 3 work in combination to achieve the desired purpose of the equalizing means. That is, all the output signals from the equalization filter 30 remain constant for every signal path, so that they can have the same characteristics, for example, the same magnitude and phase response as if they were coming from a pair of ideally matched microphones. As illustrated in FIG. 3, the first noise source comprises a noise generator 31*a* for generating a first noise signal and a loud speaker 31*b* coupled to the noise generator 31*a* for converting the noise signal into the first noise sample. The loud speaker 31*b* has a known transfer function, and acoustically connected to the microphone 21*a* with a propagation delay time (T), as noted by a dotted arrow D. Therefore, when the first noise samples from the loud speaker 31*b* travels to the microphone 21*a,* they are delayed by the delay time (T). The propagation delay time (T) is the time it takes for the first noise samples to propagate through air from the loud speaker 31*b* to the microphone 21*a*. Preferably, the delay time (T) may be selected to be integer multiple of the first noise sample, so that subsequent computations can be simplified. Then, the first noise sample is successively converted into an electrical analog signal, an amplified signal, and a digital signal via the microphone 21*a*, the amplifier 22*a*, and the analog-to-digital converter respectively. Finally, the digital signal for the first noise sample, which represents an output in a digital form from the microphone 21*a*, is input to the identification method 35 as a first input signal.

Referring to FIG. 3, the second noise source 32 produces a second noise signal as the second noise sample. The second noise signal is synchronized with the first noise signal by the synchronizer 33, and has the same signal properties as the first noise signal, so that two signals are identical at any instant in time. The second noise signal is compensated through the compensation filter 43 for the conversion factor (i.e., the known transfer function of the loud speaker 31*b*) of the first noise signal by the loud speaker 31*b*, then, delayed by the same amount of time as the above propagation delay time (T) through the delay block 34, and input to the identification block 35 as a second input signal. This second input signal can represent an input in a digital form to the microphone 21*a* since the amplifier 22*a* and the A/D converter 23*a* have flat frequency responses in the frequency interval of interest.

Subsequently, the two input signals are processed to identify an unknown transfer function (M) of the microphone 21*a* by the identification block 35. In this embodiment, the transfer function can be estimated in terms of an Auto Regressive Moving Average (ARMA); see "Digital Signal Processing", Richard A. Roberts, Clifford T. Mullis, ISBN 0-201-16350-0, pg. 486-487, the disclosure of which is incorporated herein by reference thereto. That is, a mode, which contains both poles and zeroes, is of the form described in the following equation in case of z-domain:

$$M(z)=\frac{\sum_{n=0}^{N-1} b_n z^{-n}}{1+\sum_{n=1}^{N-1} a_n z^{-n}} \quad (3)$$

In the above equation (3), the coefficients b and a can be estimated in various ways, for example, by using error minimization methods. In this embodiment, the Steiglitz McBride method may be used, but other method may also be applicable. The outcome of the identification block 35 is the coefficients b and a, which represent an estimate of the transfer function of the microphone 21*a*.

Once the transfer function M of the microphone or the signal path has been estimated as shown in the equation (3), the filter function H can be determined through the coefficient determination block 36, where a new set of coefficients for the filter function H are calculated according to the equations (1) or (2). The new coefficients are input to the equalization filter 37.

As another preferred embodiment of the present invention, a headset using the inventive concept is schematically illustrated in FIG. 2*b*, where the headset is generally denoted by a reference numeral 20A. As depicted in FIG. 2*b*, the headset further includes an adjustment filter 30*c*, in addition to all the components in the hearing aid illustrated in FIG. 2*a*. The operations of the components in FIG. 2*b* are identical to those in FIG. 2*a*, except for that of the adjustment filter 30*c*.

In the adjustment filter 30*c* of the headset 20A, an equalized signal provided by the equalization filter 30*b* (i.e., from the signal path B) is further processed according to applications of the headset. That is, the phase from the signal path B can be precisely changed relative to the signal path A, such that subsequent combination of the two signals can result in optimal speech intelligibility from any directions rather than in front of the headset user as in the hearing aid. For example, this headset can be used by a driver in a car where the driver talks to a person on the back seat, or by a pilot in a plane where the pilot talks to a co-pilot next to him.

It is noted that the equalizing filter means of FIG. 3 can be embodied as standalone equipment for determining equalizing coefficients and providing them to an equalization filter, thereby equalizing a plurality of signals from a plurality of signal paths. That is, the equipment comprises all elements of FIG. 3 except for the microphone 21*a*, the amplifier 22*a*, the A/D converter 23*a*, and the equalization filter 37. In operation of the equipment, for example, the hearing aid 20 of FIG. 2*a* or the headset 20A of FIG. 2*b* can be provided with equalization filters F1 and F2 (like the equalization filter 37 in FIG. 3) instead of the whole filter means H1 and H2. Then, by using the standalone equipment, appropriate coefficients for each equalization filter F1 and F2 can be determined according to the same operation and procedures as noted above in conjunction with the previous embodiment of FIG. 3, and stored in the hearing aid or the headset. Therefore, these coefficients are loaded into the filter when the hearing aid and headset are switched on by the end users.

While the present invention has been described with reference to specific embodiments, the description is illustrative of the invention and is not to be construed as limiting the invention. Various modifications may occur to those skilled in the art without departing from the true spirit and scope of the invention as defined by the appended claims. For example, the present invention can apply to spatial processing as well.

What is claimed is:

1. A method of equalizing output signals from a first and a second microphones, the method comprising the steps of:

generating a first predictable noise;

converting the first predictable noise to an audio output using a first converter having a known transfer function;

receiving the audio output at the first microphone and converting the audio output to a first output noise;

generating a second predictable noise;

synchronizing the first predictable noise and the second predictable noise in time by a synchronizer;

compensating the second predictable noise for the known transfer function by a compensation filter;

outputting a second output noise by the compensating filter;

determining coefficients representing a first transfer function of the first microphone based on the first and second output noises determining coefficients for a first filtering function for the first microphone, based on a single selected function for the first and second microphones and the coefficients representing the first transfer function, wherein a first product of the first transfer function of the first microphone and the first filtering function is the single selected function, and wherein the single selected function equals a second product of a second transfer function of the second microphone and a second filtering function for the second microphone; and providing the coefficients for the first filtering function to an equalization filter for filtering an output from the first microphone.

2. A method according to claim 1, wherein the single selected function is one of the first and second transfer functions.

3. A method according to claim 1, wherein the single selected function is a common factor.

4. A method according to claim 1, wherein the step of providing comprises: loading the coefficients to the equalization filter.

5. A method according to claim 1, wherein the first predictable noise is a first predictable noise sample signal, and wherein the second predictable noise is a second predictable noise sample signal, and wherein the second predictable noise sample signal has a property substantially identical to the first predictable noise sample signal.

6. A method according to claim 1 further comprising the steps of:

providing a propagation time delay for the first predictable noise before the first microphone converting the first predictable noise sample to the first output noise; and delaying the second output noise by same amount of time as the propagation delay time.

7. A method according to claim 6, wherein the first predictable noise signal is a first predictable digital noise signal, and the second predictable noise signal is a second predictable digital noise signal.

8. A method according to claim 6, wherein the propagation delay time is an integer multiple of the first predictable noise sample.

9. A method according to claim 7, wherein the step of generating the first predictable digital noise signal includes a step of utilizing a maximum length sequence generator to generate the first predictable digital noise signal.

10. A method according to claim 7, wherein the step of generating the second predictable digital noise signal includes a step of utilizing a maximum length sequence generator to generate the second predictable digital noise signal that is substantially identical to the first predictable digital noise signal on a sample-by-sample basis.

11. A method according to claim 7, wherein the first predictable digital noise signal or the second predictable digital noise signal comprises a white noise signal.

12. A method according to claim 7, wherein the first predictable digital noise signal or the second predictable digital noise signal comprises a random noise signal.

13. A method for equalizing two or more microphones in a listening devices using the method according to claim 1.

14. A method for equalizing two or more microphones in a hearing aid using the method according to claim 1.

15. A method for equalizing two or more microphones in a headset using the method according to claim 1.

16. A method according to claim 1, wherein an output signal through the first equalization filter for the first microphone is substantially equal to an output signal through an equalization filter for the second microphone with respect to phase or phase and magnitude.

17. An apparatus for equalizing output signals from a first and a second microphones, the apparatus comprising:

a first generator generating a first predictable noise;

a first converter converting the first predictable noise to an audio output, the first converter having a known transfer function, wherein a module having the first microphone receives the audio output and converts the audio output to a first output noise;

a second generator generating a second predictable noise;

a synchronizer synchronizing the first generator and the second generator;

a compensation filter compensating the known first transfer function of the first converter, the compensation filter outputting a second output noise based on the compensation;

an identification circuit for determining coefficients representing a first transfer function of the first microphone based on the first and second output noises;

a determination circuit for determining first coefficients for a first filtering function for the first microphone based on a single selected function for the first and second microphones and the coefficients representing the first transfer function, wherein a first product of the first transfer function of the first microphone and the first filtering function is the single selected function, and wherein the single selected function equals a second product of a second transfer function of the second microphone and a second filtering function for the second microphone; and a first equalization filter for filtering an output from the module using the first coefficients for a first filtering function.

18. An apparatus according to claim 17, wherein the single selected function is one of the first and second transfer functions.

19. An apparatus according to claim 17, wherein the single selected function is a common factor.

20. An apparatus according to claim 17, further comprising: a loader for loading the first coefficients to the first equalization filter.

21. An apparatus according to claim 17, wherein the first predictable noise is a first predictable noise sample signal; and wherein the second predictable noise is a second predictable noise sample signal, and wherein the second predictable noise sample signal has a property substantially identical to the first predictable noise sample signal.

22. An apparatus according to claim 21, wherein the module comprises an analog-to-digital converter coupled to the microphone converting an electrical analog signal of the first microphone into a digital signal.

23. An apparatus according to claim 17, further comprising:

a first module for providing the first predictable noise with a propagation time delay, before the first microphone converting the first predictable noise; and a second module for providing the second predictable noise with the propagation time delay.

24. An apparatus according to claim 17, wherein the first generator includes a maximum length sequence generator for generating the first predictable noise that is substantially identical to the second predictable noise on a sample-by-sample basis.

25. An apparatus according to claim 17, wherein the first converter includes a loud speaker.

26. An apparatus according to claim 17, wherein the first predictable noise is a first maximum length sequence noise, and wherein the second predictable noise is a second maximum length sequence noise being substantially identical to the first maximum length sequence noise on a sample-by-sample basis.

27. An apparatus according to claim 23, wherein the propagation delay time is an integer multiple of the first predictable noise sample.

28. An apparatus according to claim 17, wherein the first predictable noise or the second predictable noise comprises a white noise signal.

29. An apparatus according to claim 17, wherein the first predictable noise or the second predictable noise comprises a random noise signal.

30. An apparatus according to claim 17, wherein the first generator or the second generator includes a maximum length sequence generator.

31. An apparatus according to claim 17, wherein the apparatus is a listening device.

32. An apparatus according to claim 17, wherein the apparatus is a hearing aid.

33. An apparatus according to claim 17, wherein the apparatus is a headset.

34. A listening device according to claim 31, wherein a second equalization filter is provided for the second microphone, and wherein second coefficients of the second equalization filter are determined by using the single selected function, and wherein the coefficients of each of the first and second equalization filters are loaded to the corresponding equalization filter.

35. A hearing aid according to claim 32, wherein a second equalization filter is provided for the second microphone, and wherein second coefficients of the second equalization filter are determined by using the single selected function, and wherein the coefficients of each of the first and second equalization filters are loaded to the corresponding equalization filter.

36. A headset according to claim 33, wherein a second equalization filter is provided for the second microphone, and wherein second coefficients of the second equalization filter are determined by using the single selected function, and wherein the coefficients of each of the first and second equalization filters are loaded to the corresponding equalization filter.

37. An apparatus according to claim 17, wherein the identification circuit performs an Auto Regressive Moving Average (ARMA) to estimate the transfer function.

38. An apparatus according to claim 17, wherein an output signal through the first equalization filter for the first microphone is substantially equal to an output signal through an equalization filter for the second microphone with respect to phase or phase and magnitude.

39. A method of providing sound signals to a user through a system including two or more microphones, the method comprising steps of:

preparing a filtering function for each of one or more microphones, based on a single selected function for the two or more microphones, including, for each of the one or more microphones, the steps of:

generating a first predictable noise;

converting the first predictable noise to an audio output using a converter having a known transfer function;

receiving the audio output at the microphone and converting the audio output to a first output noise;

generating a second predictable noise;

synchronizing the first predictable noise and the second predictable noise in time by a synchronizer;

compensating the second predictable noise for the known transfer function by a compensation filter;

outputting a second output noise by the compensating filter;

determining coefficients representing a transfer function of the microphone based on the first and second output noises;

determining coefficients for a filtering function for the microphone based on the single selected function and the coefficients representing the transfer function, wherein a first product of the transfer function of the microphone and the filtering function is the single selected function, wherein the single selected function equals a second product of a second transfer function of the other members of the two or more microphones and a second filtering function for the other members of the two or more microphones; and providing the coefficients for the filtering function to an equalization filter for filtering an output from the microphone; and operating the system, including the step of:

for each of the two or more microphones, transferring a sound signal through the microphone and the equalization filter for the microphone.

40. A method according to claim 39, wherein the two or more microphones comprises at least a first microphone and a second microphone, and wherein an output signal through the equalization filter for the first microphone is substantially equal to an output signal through the equalization filter for the second microphone with respect to phase or phase and magnitude.

41. A sound system for two or more microphones for transmitting sound signals, comprising:

a first generator generating a first predictable noise;

a first converter converting the first predictable noise to an audio output, the first converter having a known transfer function, wherein a module having a first microphone of the two or more microphones receives the audio output and converts the audio output to a first output noise;

a second generator generating a second predictable noise;

a synchronizer synchronizing the first generator and the second generator, a compensation filter compensating the known transfer function of the first converter, the compensation filter outputting a second output noise based on the compensation;

an identification circuit for determining coefficients representing a first transfer function of the first microphone based on the first and second output noises;

a determination circuit for determining coefficients for a first filtering function for the first microphone, based on a single selected function for the two or more microphones and the coefficients representing the first transfer function, wherein a first product of the first transfer function of the first microphone and the first filtering function is the single selected function, and wherein the single selected function equals a second product of a second transfer function of the other members of the two or more microphones and a second filtering function for the other members of the two or more microphones; and an equalization filter for filtering an output from the module using the coefficients for the first filtering function.

42. A sound system according to claim 41, wherein the single selected function is one of the first and second transfer functions.

43. A sound system according to claim 41, wherein the single selected function is a common factor.

44. A sound system according to claim 41, wherein the first predictable noise is a first predictable noise signal; wherein the second predictable noise is a second predictable noise signal; and wherein the second predictable noise signal has a property substantially identical to the first predictable noise signal.

45. A sound system according to claim 44, wherein the first generator includes a maximum length sequence generator for generating the first predictable noise signal.

46. A sound system according to claim 45, wherein the maximum length sequence generator generates the second predictable noise signal.

47. A sound system according to claim 41, wherein the identification circuit performs an Auto Regressive Moving Average (ARMA) to estimate the transfer function.

48. A system according to claim 41, wherein the two or more microphones comprises a second microphone, and wherein an output signal through the equalization filter for the first microphone is substantially equal to an output signal through an equalization filter for the second microphone with respect to phase or phase and magnitude.

* * * * *